(12) United States Patent
Asao et al.

(10) Patent No.: US 9,712,919 B2
(45) Date of Patent: Jul. 18, 2017

(54) MUSIC REPRODUCING DEVICE WITH FIRST AND SECOND D/A CONVERTERS FOR CONVERTING AUDIO SIGNALS PRIOR TO INVERSION

(71) Applicant: Onkyo Corporation, Osaka (JP)

(72) Inventors: Kei Asao, Osaka (JP); Tsuyoshi Kawaguchi, Osaka (JP); Makoto Yoshida, Osaka (JP); Takanori Shiozaki, Osaka (JP); Yoshinori Nakanishi, Osaka (JP); Hiroyuki Asahara, Osaka (JP); Norimasa Kitagawa, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 0 days.

(21) Appl. No.: 15/238,634

(22) Filed: Aug. 16, 2016

(65) Prior Publication Data

US 2017/0064455 A1 Mar. 2, 2017

(30) Foreign Application Priority Data

Sep. 1, 2015 (JP) ................................. 2015-171945

(51) Int. Cl.
*H04R 5/033* (2006.01)
*H04R 5/04* (2006.01)
(Continued)

(52) U.S. Cl.
CPC ............. *H04R 5/033* (2013.01); *H03F 3/187* (2013.01); *H03F 3/45475* (2013.01); *H03F 3/72* (2013.01);
(Continued)

(58) Field of Classification Search
CPC .......... H04R 5/033; H04R 5/047; H04R 1/10; H04S 7/00
(Continued)

(56) References Cited

U.S. PATENT DOCUMENTS 6,118,989 A 9/2000 Abe et al.

FOREIGN PATENT DOCUMENTS

EP 0 847 135 A2 6/1998
JP 2008-306593 12/2008
(Continued)

OTHER PUBLICATIONS

"Making of 96kHz/24bit Super Hi-Fi DA converter (2)", Radio technique, Iar Publishing Corporation, Jul. 1, 2001; $55^{th}$ volume, No. 7, pp. 25-33 (with translation of main part).
(Continued)

*Primary Examiner* — Md S Elahee
*Assistant Examiner* — Sabrina Diaz
(74) *Attorney, Agent, or Firm* — Renner, Otto, Boisselle & Sklar, LLP

(57) ABSTRACT

To reduce signal output and wiring to a D/A converter (DAC).
A DAP 1 comprises a DAC 7 that D/A-converts LR 2 channels digital audio data into LR 2 channels analog audio data, an amplification circuit 9 that amplifies the LR 2 channels analog audio data that the DAC 7 D/A-converts, a DAC 8 that D/A-converts the LR 2 channels digital audio data into the LR 2 channels analog audio data, and an amplification circuit 10 that amplifies inverted LR 2 channels analog audio data that the LR 2 channels analog audio data that the DAC 8 D/A-converts is inverted.

2 Claims, 2 Drawing Sheets

(51) Int. Cl.
*H03F 3/187* (2006.01)
*H03F 3/45* (2006.01)
*H03F 3/72* (2006.01)
*H03M 1/66* (2006.01)

(52) U.S. Cl.
CPC ............... *H03M 1/66* (2013.01); *H04R 5/04* (2013.01); *H03F 2200/03* (2013.01); *H03F 2203/7227* (2013.01)

(58) Field of Classification Search
USPC .......................................................... 381/74
See application file for complete search history.

(56) References Cited

FOREIGN PATENT DOCUMENTS

| | | | | | |
|---|---|---|---|---|---|
| JP | 2013-005219 | * | 1/2013 | ............ | H03H 11/32 |
| JP | 2013-005291 | | 1/2013 | | |
| KR | 10-2015-0115309 | | 10/2015 | | |

OTHER PUBLICATIONS

"Work Introduction, PCM2706 USB DAC + opt: balance/unbalanced type HPA", Oct. 25, 2014, http://higa284.web.fc2.com/PCM2706_DAC_HPA.html (with machine translation).
Texas Instruments; "Low-Power Stereo Audio Codec for Portable Audio/Telephony"; Feb. 2007—Revised Dec. 2008; www.ti.com.

* cited by examiner

ововALL

MUSIC REPRODUCING DEVICE WITH FIRST AND SECOND D/A CONVERTERS FOR CONVERTING AUDIO SIGNALS PRIOR TO INVERSION

BACKGROUND OF THE INVENTION

1. Field of the Invention

The present invention relates to a music reproducing device that outputs an audio signal to a headphone.

2. Description of the Related Art

In a headphone output of a music reproducing device that outputs an audio signal to a headphone, there are systems that are called unbalanced and balanced (for example, see JP 2013-005291 A). In an unbalanced system, a three-pole terminal with a diameter of 3.5 mm is used, and the audio signal is transmitted by two kinds of "hot" and "cold". Meanwhile, in a balanced system, a four-pole terminal with a diameter of 2.5 mm is used, and a signal is transmitted by three kinds of "ground", "hot" and "cold". "Cold" is opposite phase of "hot". In case that external noise occurs, noise of the same phase is superposed on both "cold" and "hot". By inverting phase of "cold" and mixing inverted "cold" signal with "hot" signal, external noise is cancelled and amplitude of the audio signal becomes twice. For this reason, the balanced system is strong against noise and sound quality is good in the balanced system.

The music reproducing device having the balanced output includes two blocks. Each of two blocks is configured by a 2 channels D/A converter (hereinafter, referred as to "DAC") and a 2 channels amplification circuit. Each of two blocks is used for an L channel audio signal and an R channel audio signal. The music reproducing device including the balanced output includes a standard unbalanced output because the balanced system is not standard. A circuit for the balanced output and the unbalanced output is designed in common from the point of view of cost. Namely, each of two blocks is also used for an L channel audio signal and an R channel audio signal in the unbalanced output.

A digital audio signal is input to the DAC with I2S system. The L channel audio signal and the inverted L channel audio signal are input to the DAC for the L channel audio signal. Further, The R channel audio signal and the inverted R channel audio signal are input to the DAC for the R channel audio signal. Therefore, signal transmission is 4 channels, and there is a problem that each of signal output and wiring is many.

SUMMARY OF THE INVENTION

An objective of the present invention is to reduce signal output and wiring to a D/A converter (DAC).

A music reproducing device having a balanced output and an unbalanced output comprising: a first D/A converter that D/A-converts a left and right 2 channels digital audio signal into a left and right 2 channels analog audio signal; a first amplification circuit that amplifies the left and right 2 channels analog audio signal that the first D/A converter D/A-converts; a second D/A converter that D/A-converts the left and right 2 channels digital audio signal into the left and right 2 channels analog audio signal; and a second amplification circuit that amplifies an inverted left and right 2 channels analog audio signal that the left and right 2 channels analog audio signal that the second D/A converter D/A-converts is inverted.

In the present invention, an inverted left and right 2 channels analog audio signal that a left and right 2 channels analog audio signal that a second D/A converter D/A-converts is inverted is input to a second amplification circuit. Herein, a left and right 2 channels digital audio signal with I2S system can be input to a first D/A converter and the second D/A converter. For this reason, signal output to the D/A converters can be realized by 2 channels. Signal output and wiring can be reduced compared with conventional art.

Further, unbalanced output can be realized by using the first D/A converter and a first amplification circuit. Thus, in the unbalance output, wasteful electric power consumption can be reduced because the second D/A converter and the second amplification circuit can be shut down.

Further, a music reproducing device can be a music reproducing device having only the unbalanced output by not mounting the second D/A converter and the second amplification circuit.

Further, it is possible to improve the vertical symmetry because the same part of internal circuit of the D/A converters can be used as signal generation source of a non-inverted analog audio signal and signal generation source of the inverted analog audio signal.

Preferably, further comprising: a first power source circuit that supplies power source voltage to the first D/A converter and the first amplification circuit; a second power source circuit that supplies power source voltage to the second D/A converter and the second amplification circuit; and a controller, wherein the controller shuts down the second power source circuit incase of the unbalance output.

In the present invention, in case of the unbalanced output, a controller shuts down a second power source circuit. Thus, in the unbalanced output, power source voltage is not supplied from the second power source circuit to the second D/A converter and the second amplification circuit. Therefore, wasteful electric power consumption can be reduced because the second power source circuit, the second D/A converter and the second amplification circuit are shut down.

According to the present invention, signal output and wiring to a D/A converter (DAC) can be reduced.

DETAILED DESCRIPTION OF THE PREFERRED EMBODIMENTS

Figure 1:
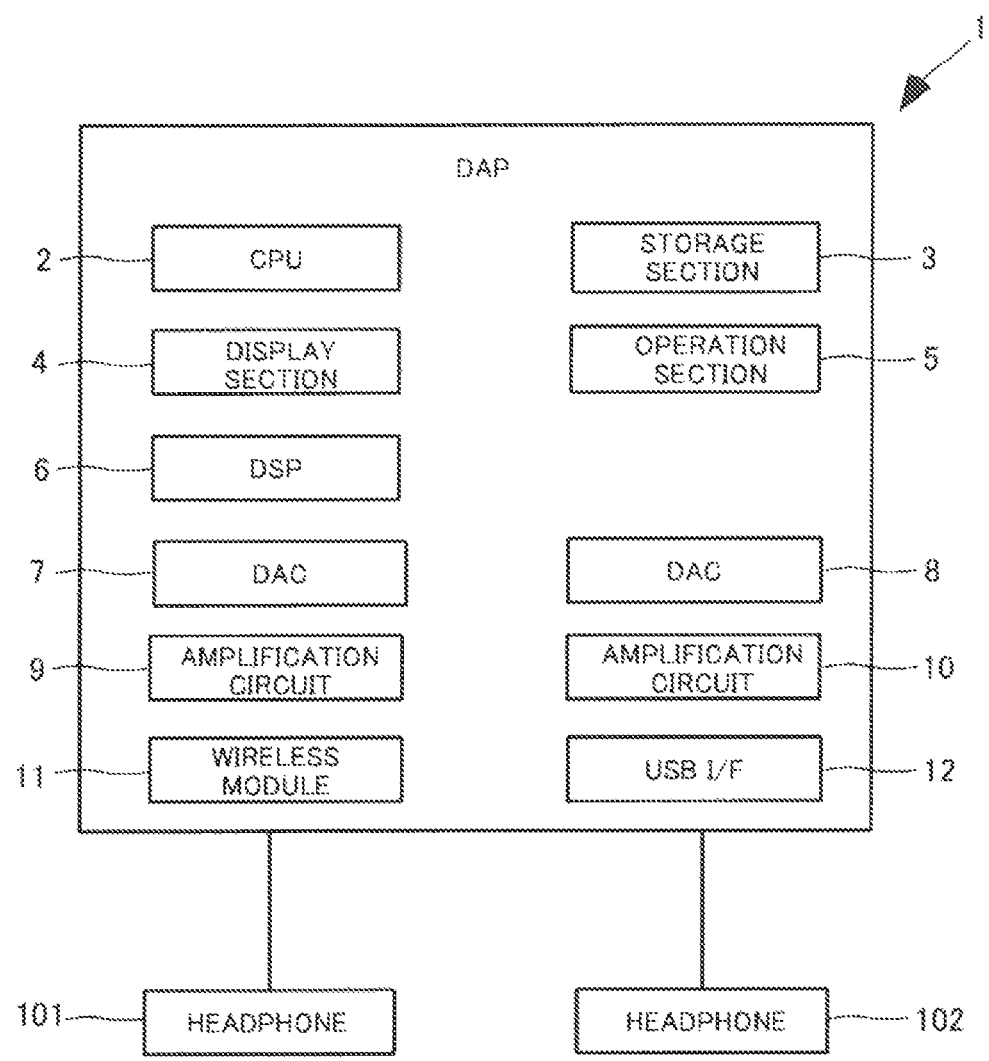
FIG. 1 is a block diagram illustrating a constitution of a digital audio player according to an embodiment of the present invention.

An embodiment of the present invention is described below. FIG. 1 is a block diagram illustrating a constitution of a digital audio player (hereinafter, referred as to "DAP") according to an embodiment of the present invention. The DAP 1 (music reproducing device) outputs analog audio data (analog audio signal) to headphones 101 and 102. Each of headphones 101 and 102 outputs an audio to external based on the analog audio data. The headphone 101 is a headphone for balanced and is connected to a balanced output terminal. The headphone 102 is a headphone for unbalanced and is connected to an unbalanced output terminal. The DAP 1 has a balanced output and an unbalanced output.

As illustrated in FIG. 1, the DAP 1 includes a CPU 2, a storage section 3, a display section 4, an operation section 5, a DSP 6, D/A converters (hereinafter, referred as to "DAC")

7 and 8, amplification circuits 9 and 10, a wireless module 11, and a USB interface (hereinafter, referred as to "USB I/F") 12.

The CPU (Central Processing Unit) 2 (controller) controls respective sections composing the DAP 1 according to a control program, an OS program or application programs. The storage section 3 is composed of a RAM (Random Access Memory) that functions as a main memory of the CPU 2, a ROM (Read Only Memory) for storing the control program and a flash memory for storing programs such as the OS program and the application programs, and various data such as the digital audio data. The storage section 3 is not limited to the illustrated constitution, and may include an HDD (Hard Disk Drive).

The display section 4 displays various images (including pictures and movies), and is composed of a liquid crystal panel. The operation section 5 has operation keys for performing various settings, and a touch panel that is linked with the display section 4. A user can input various characters and perform setting via the operation section 5.

The DSP (Digital Signal Processor) 6 performs signal processing such as equalizing to the digital audio data. Each of the DACs 7 and 8 D/A-converts the digital audio data into the analog audio data. Each of the amplification circuits 9 and 10 amplifies the analog audio data that each of DACs 7 and 8 D/A-converts and outputs amplified analog audio data to the headphone 101 or the headphone 102. Detail of the DACs 7 and 8 and the amplification circuits 9 and 10 is described latterly. The wireless module 11 is for performing wireless communication according to Bluetooth (registered trademark) standard and Wi-Fi standard. The USB I/F 12 is for performing communication according to USB standard.

Figure 2:
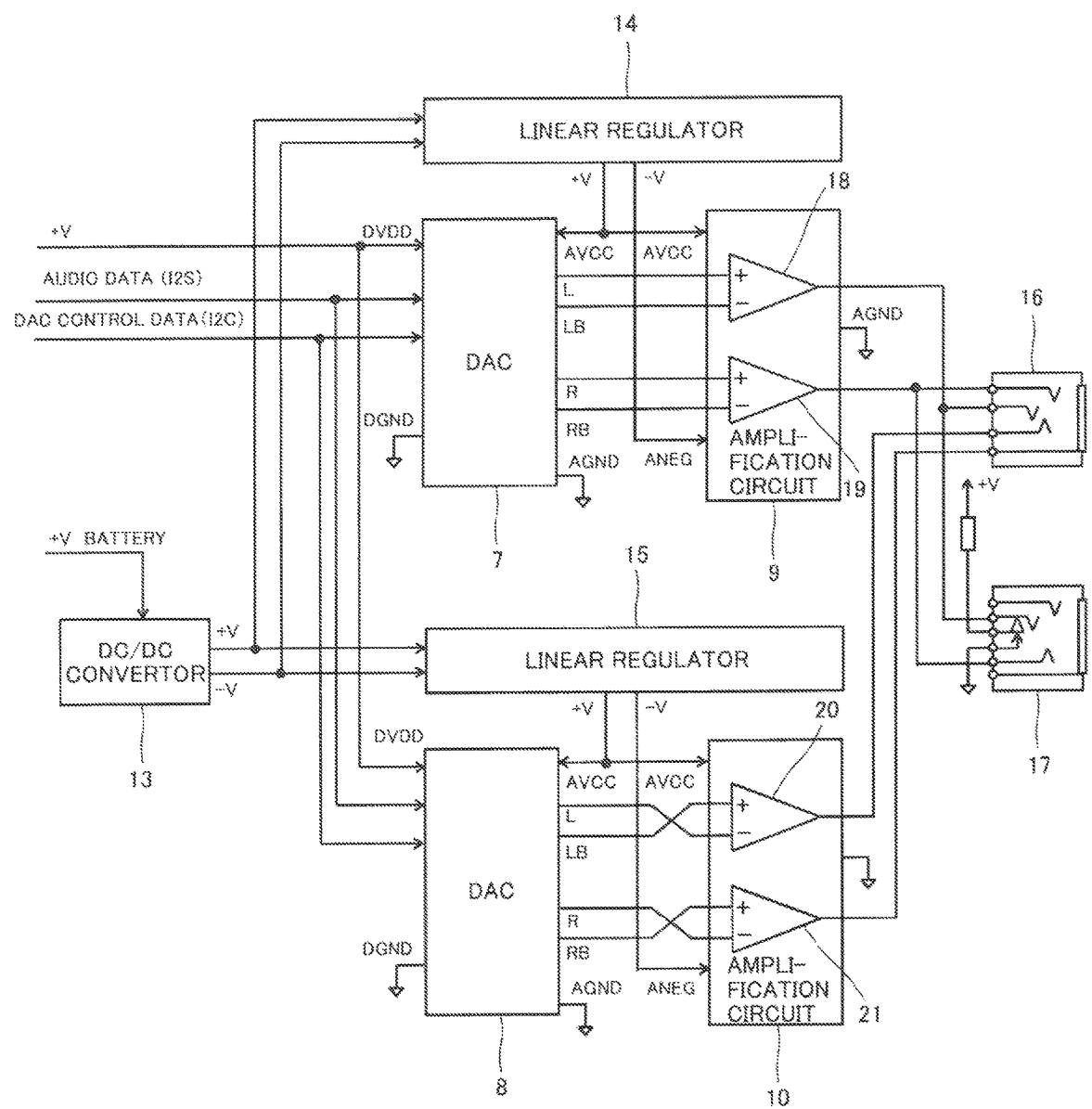
FIG. 2 is a diagram illustrating DACs, amplification circuits, and peripheral circuits of these.

FIG. 2 is a diagram illustrating the DACs 7 and 8, the amplification circuits 9 and 10, and peripheral circuits of these. As illustrated in FIG. 2, the DAP 1 further comprises a DC/DC converter 13, linear regulators 14 and 15. The DC/DC converter 13 boosts voltage that is supplied from a battery and supplies boosted voltage to the linear regulators 14 and 15. The linear regulator 14 (first power source circuit) supplies power source voltage to the DAC 7 (first D/A converter) and the amplification circuit 9 (first amplification circuit). The linear regulator 15 (second power source circuit) supplies power source voltage to the DAC 8 (second D/A converter) and the amplification circuit 10 (second amplification circuit). Each of the linear regulators 14 and 15 reduces voltage from the DC/DC converter 13 and supplies reduced voltage to each circuit.

LR (left and right) 2 channels digital audio data (digital audio signal) with I2S system is input to the positive side DAC 7 (for non-inverted signal). The DAC 7 converts the LR 2 channels digital audio data into LR 2 channels analog audio data (analog audio signal). The positive side amplification circuit 9 (for non-inverted signal) amplifies the LR 2 channels analog audio data that the DAC 7 D/A-converts. The amplification circuit 9 includes two amplifiers 18 and 19. The amplifier 18 amplifies L channel analog audio data. The amplifier 19 amplifies R channel analog audio data. The analog audio data that the amplification circuit 9 amplifies is output to a balanced output terminal 16 and an unbalanced output terminal 17.

The LR 2 channels digital audio data with I2S system is input to the negative side DAC 8 (for inverted signal). The DAC 8 D/A-converts the LR 2 channels digital audio data into the LR 2 channels analog audio data. Inverted LR 2 channels analog audio data that the LR 2 channels analog audio data that the DAC 8 D/A-converts is inverted is input to the negative side amplification circuit 10 (for inverted signal). The amplification circuit 10 amplifies the inverted LR 2 channels analog audio data. The amplification circuit 10 includes two amplifiers 20 and 21. The amplifier 20 amplifies inverted L channel analog audio data. The amplifier 21 amplifies inverted R channel analog audio data. The inverted analog audio data that the amplification circuit 10 amplifies is output to the balanced output terminal 16.

In case of the balanced output, the CPU 2 supplies power source voltage from the linear regulator 14 to the DAC 7 and the amplification circuit 9. Further, the CPU 2 supplies power source voltage from the linear regulator 15 to the DAC 8 and the amplification circuit 10. In case of the unbalanced output, the CPU 2 supplies power source voltage from the linear regulator 14 to the DAC 7 and the amplification circuit 9. Meanwhile, the CPU 2 shuts down the linear regulator 15. For this reason, the linear regulator 15, the DAC 8 and the amplification circuit 10 are shut down.

For example, if battery current that the DAP 1 consumes is 150 mA, the DAP 1 can operate for 10.6 hours in a battery of 1600 mA. For example, battery current that the linear regulator 15, the DAC 8, and the amplification circuit 10 consume is 70 mA. If the linear regulator 15, the DAC 8, and the amplification circuit 10 are operated in the unbalance output, consumption current is 150 mA+70 mA=220 mA. For this reason, the battery lasts for only about 7 hours. The battery can last long because the linear regulator 15, the DAC 8, and the amplification circuit 10 are shut down.

In the present embodiment, as described above, the inverted LR 2 channels analog audio data that the LR 2 channels analog audio data that the DAC 8 D/A-converts is inverted is input to the amplification circuit 10. Herein, the LR 2 channels digital audio data with the I2S system can be input to the DACs 7 and 8. For this reason, signal output to the DACs 7 and 8 can be realized by 2 channels. Signal output and wiring can be reduced compared with conventional art.

Further, the unbalanced output can be realized by using the DAC 7 and the amplification circuit 9. Thus, in the balanced output, wasteful electric power consumption can be reduced because the DAC 8 and the amplification circuit 10 can be shut down.

Further, the DAP 1 can be a DAP having only the unbalanced output by not mounting the DAC 8 and the amplification circuit 10.

Further, it is possible to improve the vertical symmetry because the same part of internal circuit of the DACs 7 and 8 can be used as signal generation source of non-inverted analog audio data and signal generation source of the inverted analog audio data.

Further, in the present embodiment, in case of the unbalanced output, the CPU 2 shuts down the linear regulator 15. Thus, in the unbalanced output, power source voltage is not supplied from the linear regulator 15 to the DAC 8 and the amplification circuit 10. Therefore, wasteful electric power consumption can be reduced because the linear regulator 15, the DAC 8 and the amplification circuit 10 are shut down.

The embodiment of the present invention is described above, but the mode to which the present invention is applicable is not limited to the above embodiment and can be suitably varied without departing from the scope of the present invention.

The above embodiment describes a DAP as a music reproducing device. Not limited to this, the music reproducing device may be a smartphone, a tablet PC, a USB DAC.

The present invention can be suitably employed in a music reproducing device that outputs an audio signal to a headphone.

What is claimed is:

1. A music reproducing device having a balanced output and an unbalanced output, comprising:
   a first D/A converter which converts a left channel digital audio signal and a right channel digital audio signal into a left channel analog audio signal and a right channel analog audio signal, respectively;
   a first amplification circuit that amplifies the left channel analog audio signal and the right channel analog audio signal output by the first D/A converter;
   a second D/A converter which converts the left channel digital audio signal and the right channel digital audio signal into another left channel analog audio signal and another right channel analog audio signal, respectively; and
   a second amplification circuit that amplifies the another left channel analog audio signal and the another right channel analog audio signal output by the second D/A converter, and outputs the another left channel analog audio signal and the another right channel analog audio signal in an inverted state relative to the left channel analog audio signal and the right channel analog audio signal, respectively.

2. The music reproducing device according to claim 1, further comprising:
   a first power source circuit that supplies power source voltage to the first D/A converter and the first amplification circuit;
   a second power source circuit that supplies power source voltage to the second D/A converter and the second amplification circuit; and
   a controller,
   wherein, in the case of utilizing the unbalanced output, the controller shuts down the second power source circuit whereas the first power source continues to supply power source voltage to the first D/A converter and the first amplification circuit.

* * * * *